United States Patent [19]

Tamor et al.

[11] Patent Number: 5,249,554
[45] Date of Patent: Oct. 5, 1993

[54] POWERTRAIN COMPONENT WITH ADHERENT FILM HAVING A GRADED COMPOSITION

[75] Inventors: Michael A. Tamor, Toledo, Ohio; Pierre A. Willermet, Livonia, Mich.; William C. Vassell, Bloomfield, Mich.; Arup K. Gangopadhyay, Novi, Mich.

[73] Assignee: Ford Motor Company, Dearborn, Mich.

[21] Appl. No.: 2,490

[22] Filed: Jan. 8, 1993

[51] Int. Cl.$^5$ .............................. F01L 1/14; F01L 3/00
[52] U.S. Cl. ............................. 123/90.51; 123/188.3; 123/197.4; 123/193.5; 123/193.6; 428/408; 428/446; 428/698; 428/469
[58] Field of Search ............... 123/90.51, 90.48, 41.83, 123/41.84, 188.3, 188.8, 188.9, 193.5, 193.6, 193.2, 197.4, 197.3, 668, 669; 428/408, 446, 469, 698, 704, 697

[56] References Cited

U.S. PATENT DOCUMENTS

| | | | |
|---|---|---|---|
| 3,545,415 | 12/1970 | Mori | 123/90.51 |
| 4,100,330 | 7/1978 | Donley | 428/429 |
| 4,481,237 | 11/1984 | Bosshart et al. | 427/376.4 |
| 4,503,130 | 3/1985 | Bosshart et al. | 428/632 |
| 4,525,417 | 6/1985 | Dimigen et al. | 428/244 |
| 4,538,562 | 9/1985 | Matsui et al. | 123/90.51 |
| 4,597,844 | 7/1986 | Hiraki et al. | 428/408 |
| 4,661,409 | 4/1987 | Kieser et al. | 428/408 |
| 4,774,130 | 9/1988 | Endo et al. | 428/216 |
| 4,777,090 | 10/1988 | Ovshinsky et al. | 428/408 |
| 4,837,089 | 6/1989 | Araki et al. | 428/552 |
| 4,849,290 | 7/1989 | Fujimori et al. | 428/408 |
| 4,859,493 | 8/1989 | Lemelson | 427/45.1 |
| 4,873,150 | 10/1989 | Moi et al. | 123/90.51 |
| 4,876,996 | 10/1989 | Mayer et al. | 123/90.51 |
| 4,889,776 | 12/1989 | Priceman | 428/629 |
| 4,904,542 | 2/1990 | Mroczkowski | 428/610 |
| 4,909,198 | 3/1990 | Shiraya et al. | 123/90.51 |
| 4,911,625 | 3/1990 | Begg et al. | 419/6 |
| 4,921,734 | 5/1900 | Thorpe et al. | 123/668 |
| 4,932,331 | 6/1990 | Kurihara et al. | 428/408 |

(List continued on next page.)

FOREIGN PATENT DOCUMENTS 0435312 7/1991 European Pat. Off. .

OTHER PUBLICATIONS

"Interface Modifications for Improving the Adhesion of a-C:H Films to Metals", by A. Grill, et al., Rapid Communications, Apr. 1988 Materials Research Society, pp. 214–217.

"Bonding, Interfacial Effects and Adhesion in DLC", by A. Grill, et al, SPIE vol. 969 Diamond Optics, Jan. 1988, pp. 52–56.

"Nucleation and Growth of Low-Pressure Diamond", by Benno Lux, et al, Diamond and Diamond-Like Films and Coatings, Jan. 1991, pp. 579–580.

"Atomic Constraint in Hydrogenated 'Diamond-Like' Carbon", by M. A. Tamor, et al., Appl. Phys. Lett. 58 (6), Feb. 11, 1991, American Institute of Physics, pp. 592–594.

Primary Examiner—Willis R. Wolfe
Assistant Examiner—Weilun Lo
Attorney, Agent, or Firm—Roger L. May; Joseph W. Malleck

[57] ABSTRACT

A powertrain component (10) for use in an internal combustion engine, the powertrain component comprising a coating system including a film (30) selected from the group consisting of amorphous hydrogenated carbon, silicon-doped amorphous hydrogenated carbon, boron-, nitrogen-, boron nitride-, or metal-doped amorphous hydrogenated carbon, and mixtures thereof. The film (30) is formed on the powertrain component (10), and imparts the characteristics of low friction and wear resistance to the component. The powertrain component (10) also includes an interlayer (42) formed between the film and the component. The interlayer (42) accommodates stresses engendered by formation of the film (30), and thereby improves adherence of the film (30) to the substrate (10). To enable engineering of desired surface properties, the film (30), the interlayer (42), or both may be provided with a graded composition.

17 Claims, 11 Drawing Sheets

U.S. PATENT DOCUMENTS

| | | | |
|---|---|---|---|
| 4,935,303 | 6/1990 | Ikoma et al. | 428/408 |
| 4,942,732 | 7/1990 | Priceman | 60/261 |
| 4,960,643 | 10/1990 | Lemelson | 428/408 |
| 4,974,498 | 12/1990 | Lemelson | 123/193.6 |
| 4,987,865 | 1/1991 | Schenkel | 123/193.6 |
| 4,988,421 | 1/1991 | Drawl et al. | 204/192.3 |
| 4,990,403 | 2/1991 | Ito | 428/408 |
| 5,014,605 | 5/1991 | Santi | 123/193.6 |
| 5,017,022 | 5/1991 | Ruggles et al. | 384/100 |
| 5,040,501 | 8/1991 | Lemelson | 123/188.3 |
| 5,064,682 | 11/1991 | Kiyama et al. | 427/38 |
| 5,067,826 | 11/1991 | Lemelson | 384/492 |
| 5,068,871 | 11/1991 | Uchida et al. | 373/17 |
| 5,071,677 | 12/1991 | Patterson et al. | 427/249 |
| 5,094,915 | 3/1992 | Subramaniam | 428/408 |
| 5,100,565 | 3/1992 | Fujiwara et al. | 251/368 |
| 5,112,146 | 5/1992 | Stangeland | 384/492 |
| 5,124,179 | 6/1992 | Garg et al. | 427/249 |
| 5,131,356 | 7/1992 | Sick et al. | 123/193.2 |
| 5,135,807 | 8/1992 | Ito et al. | 428/334 |
| 5,135,808 | 8/1992 | Kimock et al. | 428/336 |
| 5,146,313 | 9/1992 | Kato et al. | 357/74 |

WITH INTERLAYER
WEAR TRACK ON Al-11.6 % Si ALLOY AT THE END OF ABOUT 30 MINUTES TEST

NO INTERLAYER
WEAR TRACK ON Al-11.6 % Si ALLOY AT THE END OF ABOUT 30 MINUTES TEST

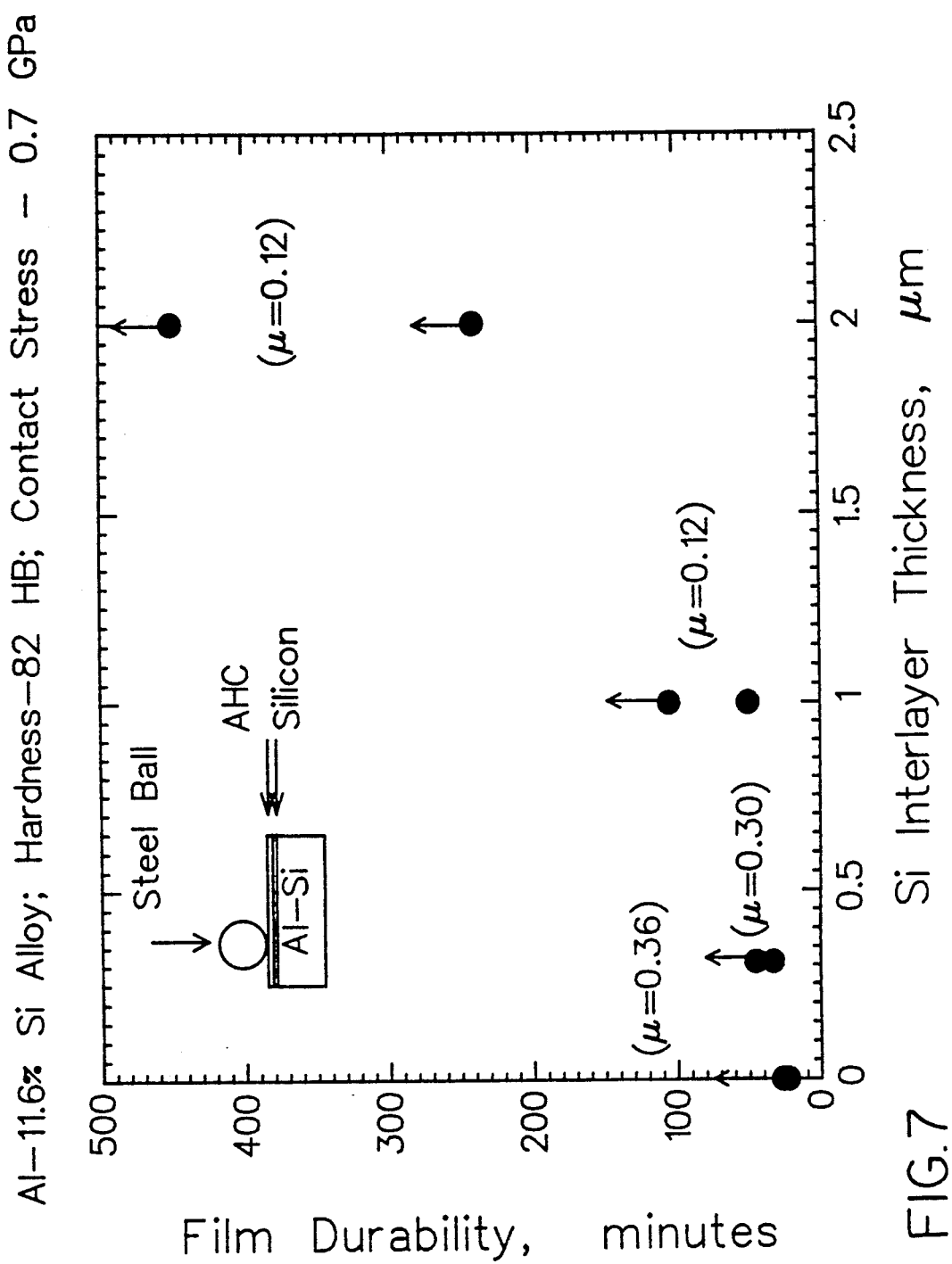

UNCOATED STEEL

AL INTERLAYER (0.1 μm)

Si INTERLAYER (0.1 μm)

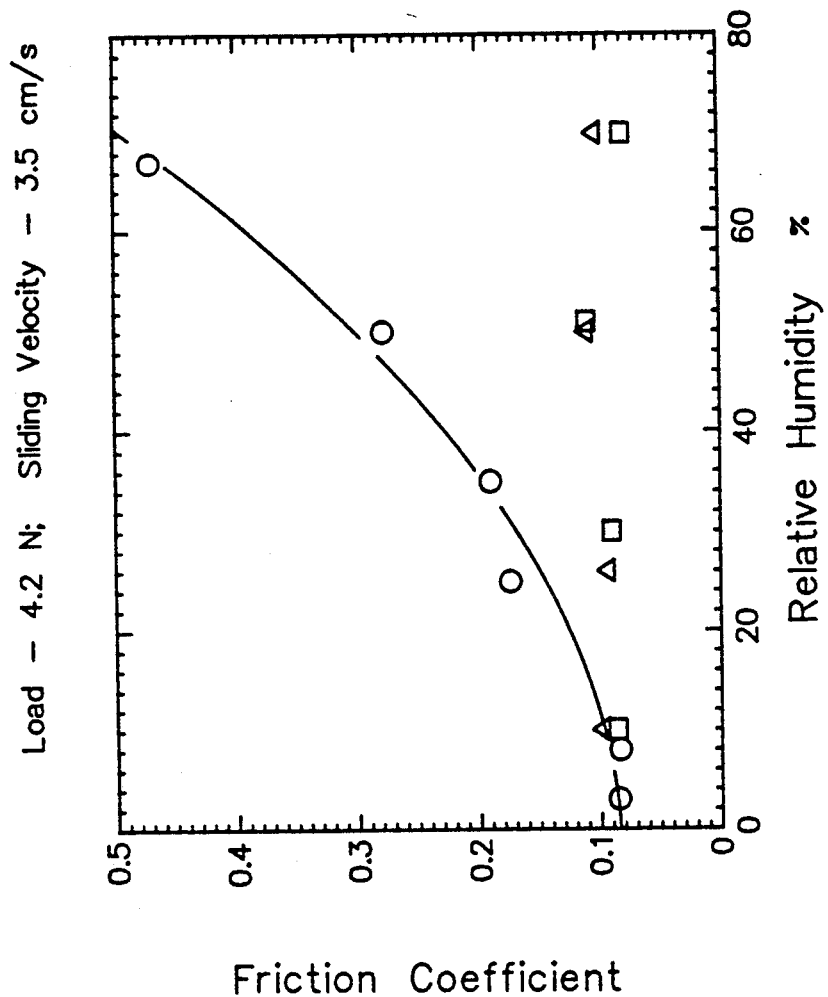

POWERTRAIN COMPONENT WITH ADHERENT FILM HAVING A GRADED COMPOSITION

BACKGROUND OF THE INVENTION

1. Field Of The Invention

The present invention relates to a powertrain component for use in an internal combustion engine. More particularly, the invention relates to a component having a hard, wear resistant film having a graded composition formed thereupon.

2. Related Art Statement

In most internal combustion engines, there are various powertrain components. Whether or not the powertrain component operates in an oil-starved environment, traditional problems of noise, vibration, and wear have resulted from frictional and normal forces generated between adjacent interacting surfaces, particularly over prolonged periods at high operating temperatures.

Illustrative of approaches to such problems is EP 435 312 A1 which was published on Jul. 3, 1991. That reference discloses a hard and lubricous thin film of amorphous carbon-hydrogen-silicon and a process for producing the film by heating in a vacuum at 600° C. The disclosed film is applied to an iron-base metallic material, thereby forming a hard coating of low friction. However, at such temperatures, there may be a tendency to melt the substrate, and if the substrate is made of steel, to detemper it. Additionally, there may be a loss of net shape.

Formation of hard, lubricous films (also referred to as "coatings") on substrates can be accomplished by several known processes. Such processes include radio frequency (RF), ion beam and microwave plasma chemical vapor deposition (CVD) and physical vapor deposition (PVD) techniques. If applied satisfactorily, such coatings could reduce friction and wear. Depending on the technique used, several problems may remain. They include delamination of the film in an operating environment, which may be occasioned in part by compressive stresses engendered during deposition at the film/substrate interface. In general, the thicker the film, the higher the compressive stresses engendered during film formation. If such stresses are excessive, delamination may result. Other problems may arise from chemical incompatibility of the substrate and the coating.

As an example, aluminum and its alloys have been among those substrates with which conventional deposition techniques have yielded only marginal results. This is because, in part, aluminum carbides tend to be water soluble and unstable, especially in conditions of prolonged exposure to high humidity. Accordingly, the direct application of carbonaceous films to an aluminum-containing substrate may be intrinsically problematic.

Against this background, the need has arisen to devise a powertrain component and method for preparing a substrate-coating system which has a reliably adherent hard, wear resistant film, while accommodating compressive stresses generated during film formation and avoiding problems associated with chemical incompatibility between the film and the substrate.

The need has also arisen for a substrate-interlayer-film system which permits surface engineering of a wide variety of substrate materials to enhance friction, wear, and chemical characteristics. Ideally, such a system would permit simultaneous optimization of adhesion to the substrate, mechanical properties, stress state of the interlayer, friction, and wear properties of the resulting surface.

SUMMARY OF THE INVENTION

The present invention discloses a powertrain component for use in an internal combustion engine and a method for applying a hard, wear resistant film which firmly adheres to the component. The present invention also discloses a powertrain component with an amorphous hydrogenated carbon film which significantly reduces friction and wear. Also disclosed is an interlayer system for improving adherence and ability to withstand mechanical stresses.

Optimal combinations of surface and bulk qualities can be obtained by coating solid powertrain components fabricated of a material with desirable bulk properties with films which are characterized by the desired surface properties. Such bulk properties include high strength, low fatigue, and light weight. The desired surface properties include wear resistance, low friction, lubricant compatibility, and other chemical properties.

The present invention discloses physical vapor deposition (PVD), for example, by sputtering or chemical vapor deposition (CVD) of coating systems composed of various combinations of amorphous hydrogenated carbon, silicon-doped amorphous hydrogenated carbon, boron-, nitrogen-, boron nitride-, or metal- and doped amorphous hydrogenated carbon, silicon, silicon carbide, silicon nitride, boron nitride, and mixtures thereof.

The composition of such coating systems, including films or interlayers can be varied continuously or abruptly throughout their thickness so as to optimize the properties of each, while assuring strong chemical bonding.

The disclosed graded coating system may be deposited in a single deposition step by varying the composition of the precursor vapors continuously (if a continuous composition profile is desired) or abruptly (if an abruptly varying composition profile is desired) in the deposition chamber.

Accordingly, an object of the present invention is to provide a powertrain component for use in an internal combustion engine and a method for applying a hard, wear resistant film which firmly adheres to the component.

Another object of the present invention is to provide a coating system having an interlayer between the carbon film and the component, the interlayer serving to improve adherence of the film to the component by accommodating compressive stresses and avoiding problems of chemical incompatibility.

A further object of the present invention is to provide a satisfactory film-interlayer-substrate system having a graded or abruptly varying composition which can improve adherence, while providing additional mechanical support to a load-bearing surface.

The above-noted objects may be realized on powertrain and engine components other than on the valve actuation mechanism itself.

BRIEF DESCRIPTION OF THE DRAWINGS

FIG. 7 is a graph illustrating the relationship of film durability with the thickness of a silicon interlayer;

FIG. 12 is a graph illustrating the variation of friction coefficients of silicon-free and silicon-containing amorphous hydrogenated carbon films with relative humidity.

BEST MODES FOR CARRYING OUT THE INVENTION

Optimal combinations of surface and bulk qualities can be obtained by coating solid powertrain components fabricated of a material with desirable bulk properties with coating systems of films and interlayers which are characterized by the desired surface properties. Such properties include high strength, low fatigue, and light weight. The desired surface properties include wear resistance, low friction, lubricant compatibility, and other chemical properties.

The present invention discloses the deposition of coating systems composed of various combinations of amorphous hydrogenated carbon, silicon-doped amorphous hydrogenated carbon, boron-, nitrogen-, boron nitride-, or metal-doped amorphous hydrogenated carbon, silicon, silicon carbide, silicon nitride, boron nitride, and mixtures thereof.

Figure 4:
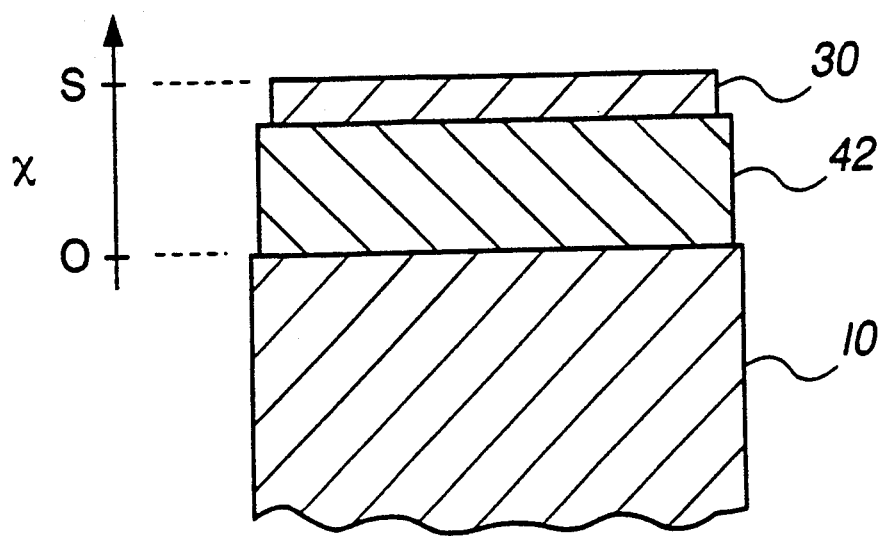
FIG. 4 is a schematic cross sectional view illustrating the component substrate, a graded interlayer, and a low wear coating deposited thereupon.

The composition of such films can be varied continuously from the coating-substrate interface, through the thickness of the coating, to the surface so as to optimize the properties of each, while assuring strong chemical bonding throughout the thickness of the film. The graded composition may result in a blurring of distinction between the interlayer 42 and the film 30 (FIG. 4).

The disclosed graded coating may be deposited in a single deposition step by varying the composition of the precursor vapors and other conditions in the deposition chamber.

An illustrative example of the disclosed invention concerns the deposition of an amorphous hydrogenated carbon film on a lightweight powertrain component, such as a valve lifter. Characteristic of amorphous films is the absence of evidence of any pattern, structure, or crystallinity which is discernable by X-ray diffraction techniques. Details of a graded amorphous hydrogenated carbon film system on such components are described in co-pending, commonly assigned U.S. parent application Ser. No. 08/001,989 filed on even date herewith by Pierre A. Willermet, Arup K. Gangopadhyay, Michael A. Tamor, and William C. Vassell entitled "POWERTRAIN COMPONENT WITH AMORPHOUS HYDROGENATED CARBON FILM," the disclosure which is hereby incorporated by reference herein.

Details of a ceramic coating system on such components are described in co-pending, commonly assigned U.S. parent application Ser. No. 08/002,190 filed on even date herewith by Pierre A. Willermet, Arup K. Gangopadhyay, Michael A. Tamor, William C. Vassell, and Margherita Zanini-Fisher entitled "CHEMICAL VAPOR DEPOSITED LOW WEAR COATING OF Si-N OR Si-N-O FOR ENGINE COMPONENTS," the disclosure of which is hereby incorporated by reference.

Figure 1:
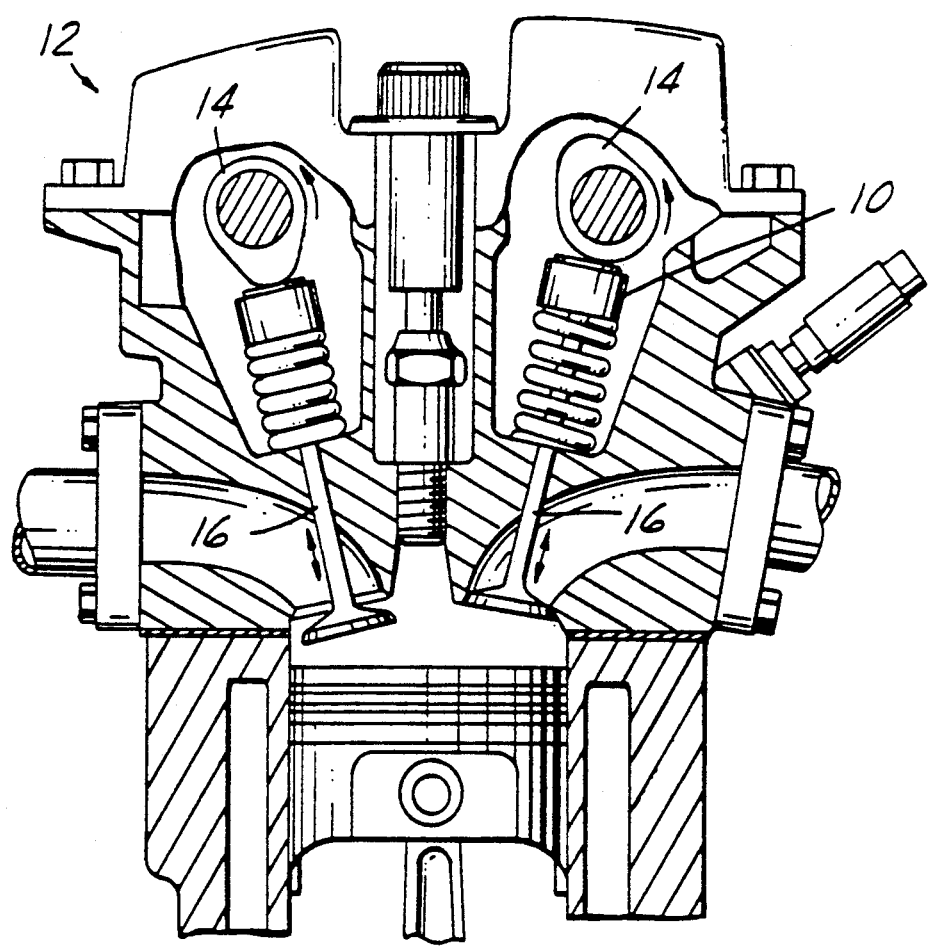
FIG. 1 is a schematic sectional view of an internal combustion engine including a valve lifter as illustrative of other powertrain components which exhibit the facets of the present invention.
Figures 2, 3:
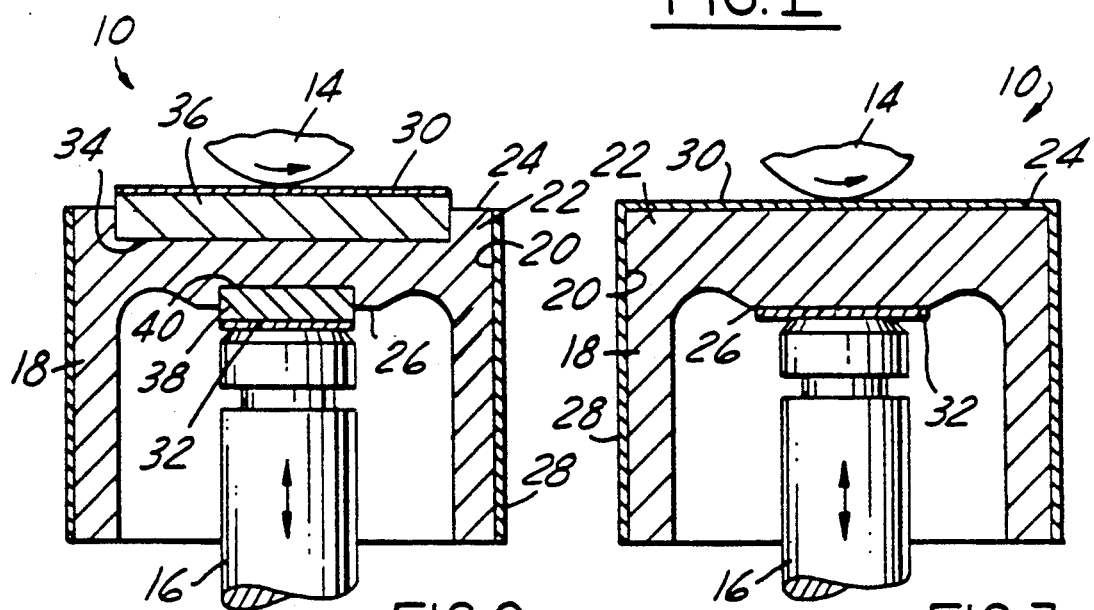
FIG. 2 is a schematic sectional view of the component according to the present invention.
FIG. 3 is a schematic sectional view of an alternate embodiment of the component according to the present invention.

Turning first to FIGS. 1-3 of the drawings, there is depicted, as illustrative of other powertrain components, a valve lifter 10 for use in an internal combustion engine 12 under conditions which may or may not be oil-starved. Typically, the valve lifter is interposed between a cam 14 and a valve stem 16. Often, the valve lifter reciprocates within a guide channel formed within the cylinder head, between which frictional forces may be generated.

The valve lifter 10 has a hollow cylindrical body 18 with a continuous sidewall 20. At an upper end 22 of the sidewall 20 is a cam-facing surface 24 which cooperates with the cam 14. Disposed below the cam-facing surface 24 within the hollow cylindrical body 18 is a stem-facing surface 26 which cooperates with the valve stem 16. To impart the characteristics of low friction and wear resistance to the valve lifter 10, a film 28 is formed on one or more wear surfaces, such as the sidewall 20 of the body 18.

As a result, the valve lifter 10 can be operated, even without effective lubrication in an oil-starved environment, for prolonged periods. Without such a coating, most valve lifters fail—especially in an oil-starved environment—if made of materials like aluminum, which characteristically exhibits poor wear resistance. Failure may result in seizure and welding.

The coatings of the present invention are attractive because aluminum, for example, of which some powertrain components are made, is generally not durable under high loading conditions. Amorphous hydrogenated carbon films (AHC), for example, are therefore useful in protecting such substrates, especially in conditions of marginal lubrication.

Figure 5:
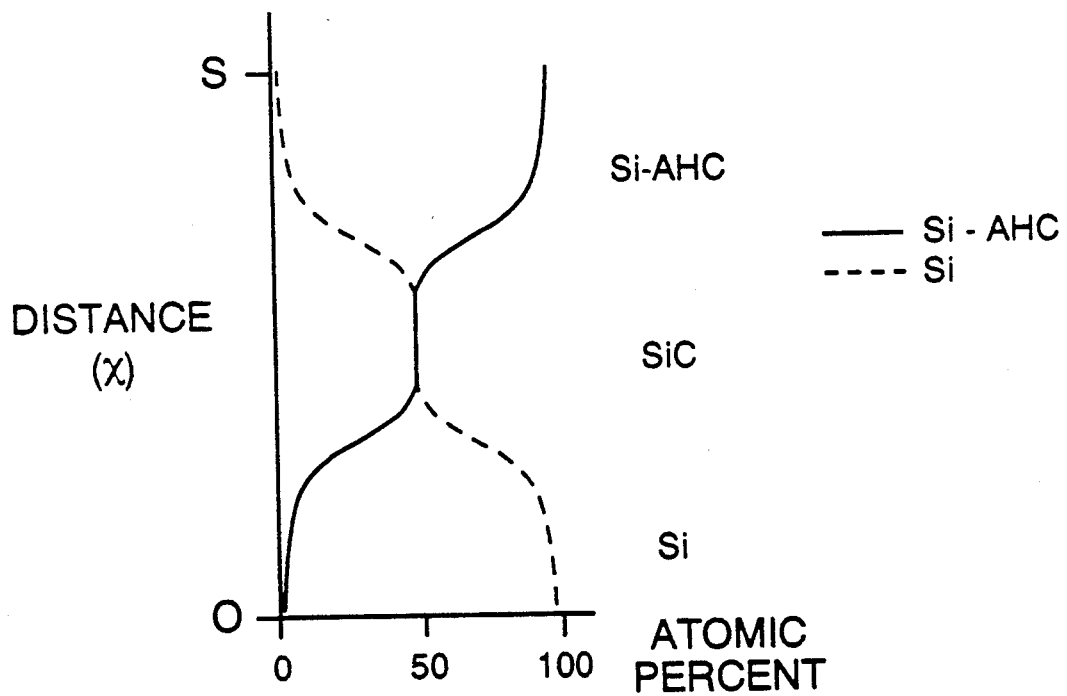
FIG. 5 is a graph illustrating a compositional profile of a Si-SiC-amorphous hydrogenated carbon (AHC) graded layer coating system.

As depicted in FIGS. 4-5, the coating system includes an interlayer 42 formed between the film 30 and the substrate 10. The coating system may comprise a continuously or abruptly varying composition gradient which enables surface engineering of a wide variety of film-interlayer-substrate systems to enhance friction, wear, and chemical compatibility. Additionally, such a graded interlayer permits simultaneous optimization of adhesion to the substrate, mechanical properties and stress state of the interlayer, and friction and wear properties of the surface.

For example, a layer of silicon several microns thick enhances both the adhesion and durability of the amorphous hydrogenated carbon film and its durability on aluminum, especially in environments involving rubbing contact.

Further enhancement of the resulting properties of the powertrain components may be achieved by deposition of a graded interlayer. Illustrative is an interlayer which is initially silicon close to the substrate 10, but gradually changes to harder silicon carbide, and thence to still harder amorphous hydrogenated carbon (FIG. 5). Durability of the amorphous hydrogenated carbon, which is by itself limited in thickness by intrinsic stress, may be enhanced over what is obtained with a simpler silicon layer alone. To optimize adhesion, the interlayer 42 may have a thickness of about 200 angstroms. Thicker interlayers, however, such as those primarily designed for supporting significant mechanical loads, may have a thickness of up to 30 microns.

Because the stress state of the disclosed coating systems can be controlled, the compressive stress of the amorphous hydrogenated carbon film can be cancelled by tensile stress in the interlayer beneath.

Inclusion of 1%–35 atomic percent silicon (exclusive of hydrogen) in the amorphous hydrogenated carbon coating has been shown simultaneously to reduce friction and compressive stress. Additionally, a thick, durable, low-stress coating system may be built by alternating tensile hard layers with compressive amorphous hydrogenated carbon layers, or doped amorphous hydrogenated carbon layers as described above.

By careful choice of the compositional profile in the graded layer, film adhesion to certain substrate materials may be obtained in combination with surface properties which are optimized for low friction, low wear, hardness, and lubricant compatibility. Such substrates include aluminum, an aluminum-silicon alloy, an aluminum-copper-silicon alloy, steel and other ferrous alloys, magnesium, magnesium alloys, aluminum nitride, titanium Ti-Al alloys, ceramics, and mixtures thereof.

The inclusion of Si, Ge, or one or some of the many metals which form strong carbides from columns IVB, VB, and VIB of the periodic table can also be used to modify the properties of carbon-rich compositions. For example, because silicon itself is a strong carbide-former, Si-rich compositions adhere well to most metal substrates. Ceramic components are well matched by intermediate compositions, which may even match the ceramic exactly.

Another advantage of the graded layer technique disclosed herein is that it offers an engineering margin in that once the outer layer is worn through, the desirable surface properties are lost only gradually. Catastrophic de-adhesion is suppressed.

Turning again to FIGS. 4-5, there is depicted an exemplary compositional profile for a silicon-silicon carbide-amorphous hydrogenated carbon graded layer system. FIG. 4 schematically illustrates a powertrain component 10 which serves as a substrate for a graded interlayer 42, upon which is deposited a low wear coating 30.

FIG. 5 depicts the compositional changes of silicon and amorphous hydrogenated carbon with distance from the substrate 10. Close to the substrate 10, the amount of silicon is relatively high, and the amount of amorphous hydrogenated carbon is correspondingly low. The converse is true in regions close to the outer surface S of the coating 30. A graded interlayer 42 comprises essentially SiC, except at the interfacial layer between the interlayer 42 and the coating 30.

It will thus be apparent that the disclosed coating system may include a composition gradient such that the outside surface of the coating system comprising a film which predominantly includes a first group consisting of amorphous hydrogenated carbon, silicon-doped amorphous hydrogenated carbon, boron-, nitrogen-, boron nitride-, or metal-doped amorphous hydrogenated carbon. Intermediate portions of the coating system comprise an interlayer which predominantly includes a constituent selected from a second group consisting of silicon, silicon carbide, silicon nitride, boron nitride, and mixtures thereof. The proportion of the constituent selected from the second group increases with proximity to the substrate.

Alternatively, the interlayer, the film, or both may embody the composition profile. Within each structure, the composition profile may vary continuously, or abruptly.

Preferably, where the substrate is of a relatively soft material, such as aluminum, the interlayer should be relatively thick (exceeding >1 micron). The provision of a relatively thick (exceeding >1 micron) silicon interlayer serves to improve adhesion and durability of low-wear coatings (having a thickness for example of about 1½ microns) on mechanical components which are subject to sliding contact, rolling contact, or both. For example, a 3 micron silicon interlayer results in a system having a performance akin to that exhibited by an amorphous hydrogenated carbon film when applied directly to silicon. As noted earlier, depending on the substrate material and component operating conditions, the interlayer may have a thickness between 200 angstroms (for adhesion only) and 30 microns (for additional mechanical support).

Sputtered or vapor-deposited amorphous silicon is ideal and is preferable for use as a thick interlayer because its hardness approaches that of ceramics and it is chemically compatible with many film coatings and substrate materials, such as steel and other ferrous materials, titanium, magnesium, aluminum, Ti-Al, Al-N, SiC, SiN, and other ceramics. Additionally, silicon also assures excellent adhesion and is readily deposited at high rates by a variety of chemical and physical vapor deposition methods. These include but are not limited to sputtering, thermal or electron-beam evaporation, and thermal or plasma decomposition of a silicon-containing vapor.

Results of studying a silicon interlayer system for amorphous hydrogenated carbon coatings shows that at high loads, the low friction of hydrogenated coatings (0.1) is preserved only on very hard substrates, such as silicon. Coatings on steel exhibit higher friction (0.3) while those on softer aluminums were higher still (0.36), for which the films failed rapidly. It has also been found that the use of a 1 micron silicon interlayer on an aluminum substrate restores the low friction and durability of an amorphous hydrogenated carbon film to its original values. The advantages of the silicon interlayer are maximized for substrates significantly softer than the coating, such as steel, magnesium or aluminum-based light weight components which although strong, tend to have poor surface wear characteristics.

Such test results among others are depicted in FIGS. 6-12.

Figure 6A:
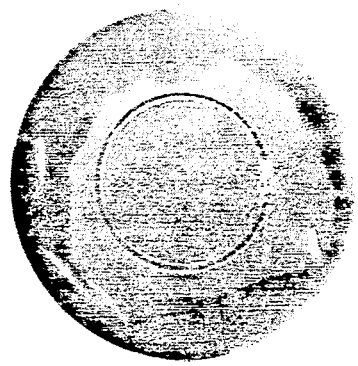
FIGS. 6A-6B are optical micrographs depicting test results showing the effect on adhesion and durability of coating systems by a silicon interlayer on an aluminum silicon alloy.
Figure 6B:
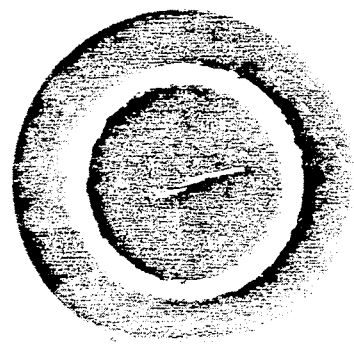

Turning first to FIGS. 6A-6B, optical micrographs are depicted which show that the adhesion and durability of certain coating systems can be significantly increased by, for example, a silicon interlayer deposited on an aluminum silicon alloy. Under ideal test conditions, the film on the substrate with no interlayer was completely removed. However, the film remained intact for the component with the silicon interlayer.

FIG. 7 shows that the durability of the coating system can be improved by increasing the thickness of, for example, a silicon interlayer. This is because the hard silicon interlayer provides a mechanical support to the softer aluminum alloy and tends to prevent plastic deformation. The data points with a vertical arrow indicate that the coating did not fail at the end of the test. However, for the specimens with an interlayer with 0.3 microns and 1 micron in thickness, post test inspection revealed that failure was imminent. FIG. 7 also illustrates that the friction coefficient of the coating system decreases as the silicon interlayer thickness increases.

Figure 8:
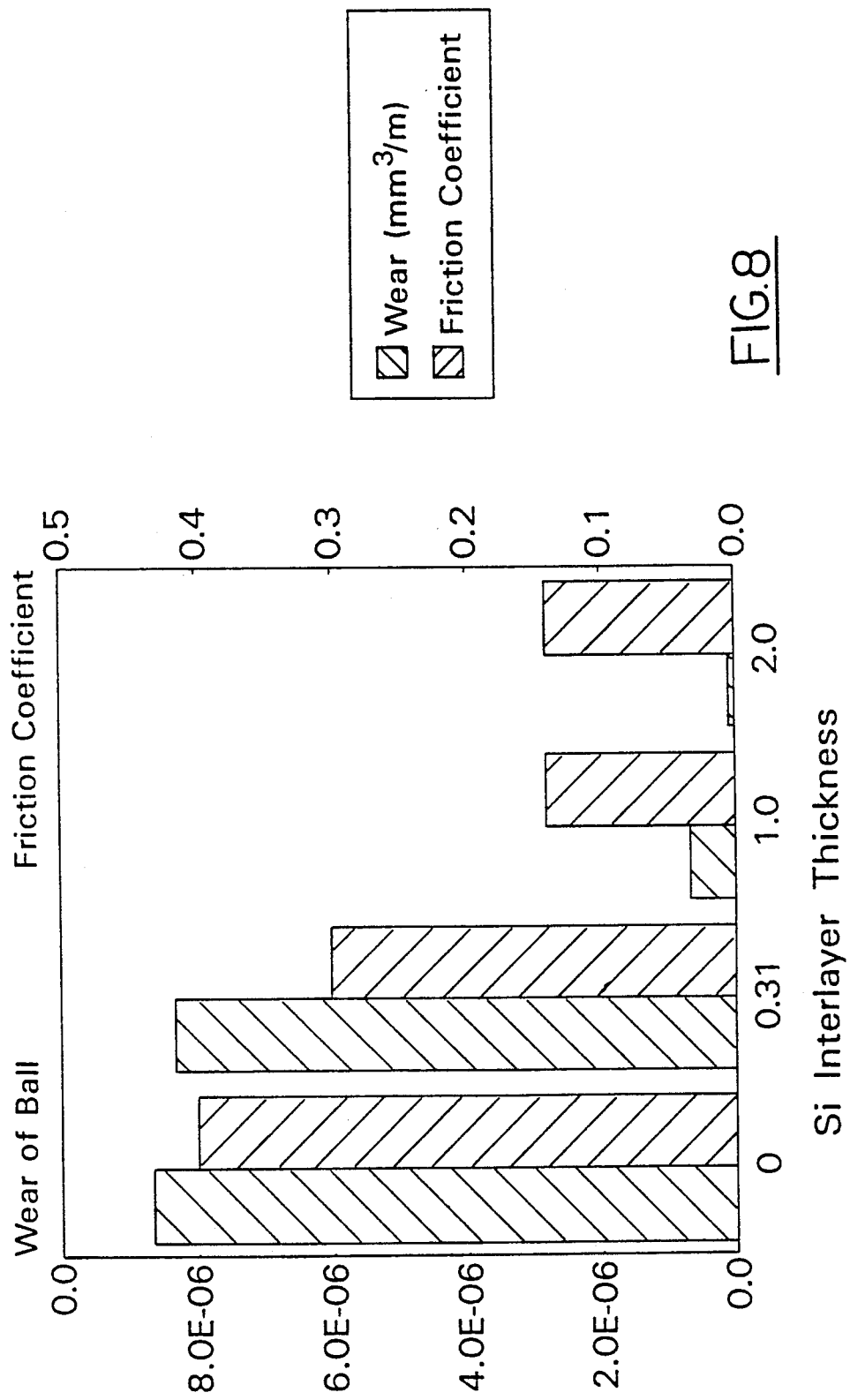
FIG. 8 illustrates the decrease in wear rate of a steel ball sliding against a film as the silicon interlayer thickness is increased.

Turning now to FIG. 8, there is a graph which illustrates that the wear rate of a steel ball sliding against a film decreases with thickness of the silicon interlayer.

Figure 9A:
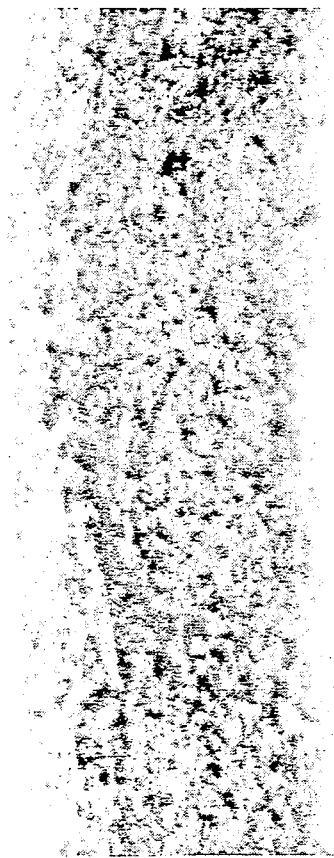
FIGS. 9A-9C are optical micrographs of an uncoated steel, an aluminum interlayer, and a silicon interlayer, respectively, illustrating the advantage of the steel substrate.
Figure 9B:
Figure 9C:
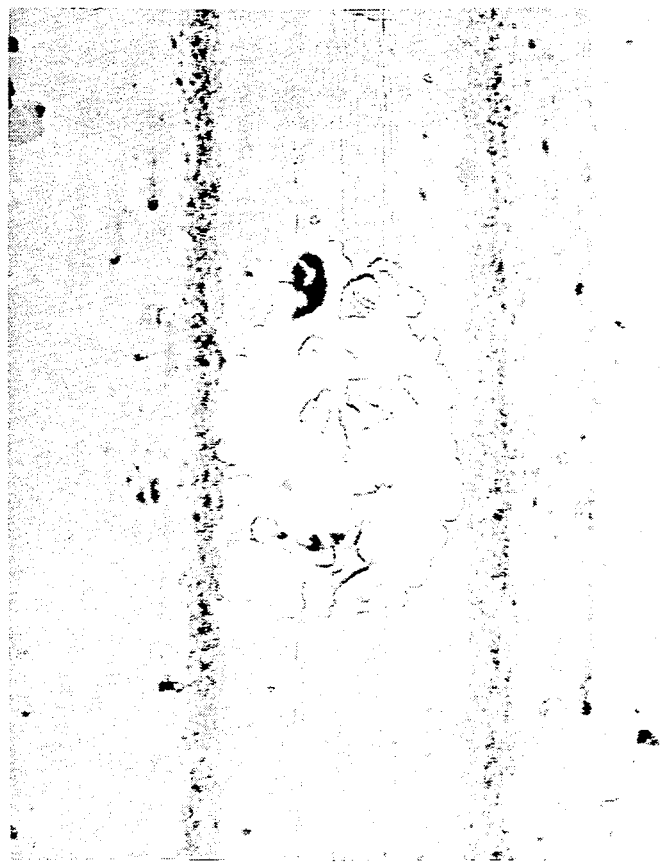

The optical micrographs depicted in FIGS. 9A–9C illustrate the advantage of a silicon interlayer in preventing plastic deformation of a hardened steel. The wear track on uncoated steel (FIG. 9A) shows signs of severe wear and plastic deformation. The extent of plastic deformation appears to be somewhat reduced with an aluminum interlayer (FIG. 9B). However, with a silicon interlayer (FIG. 9C), the wear track appears to be significantly smoother—although a few wear marks are evident. The spall (white area) on the wear track (FIG. 9C) of the specimen with a silicon interlayer occurred during post-testing storage. The spalled area reveals the deformation under the film.

Figure 10:
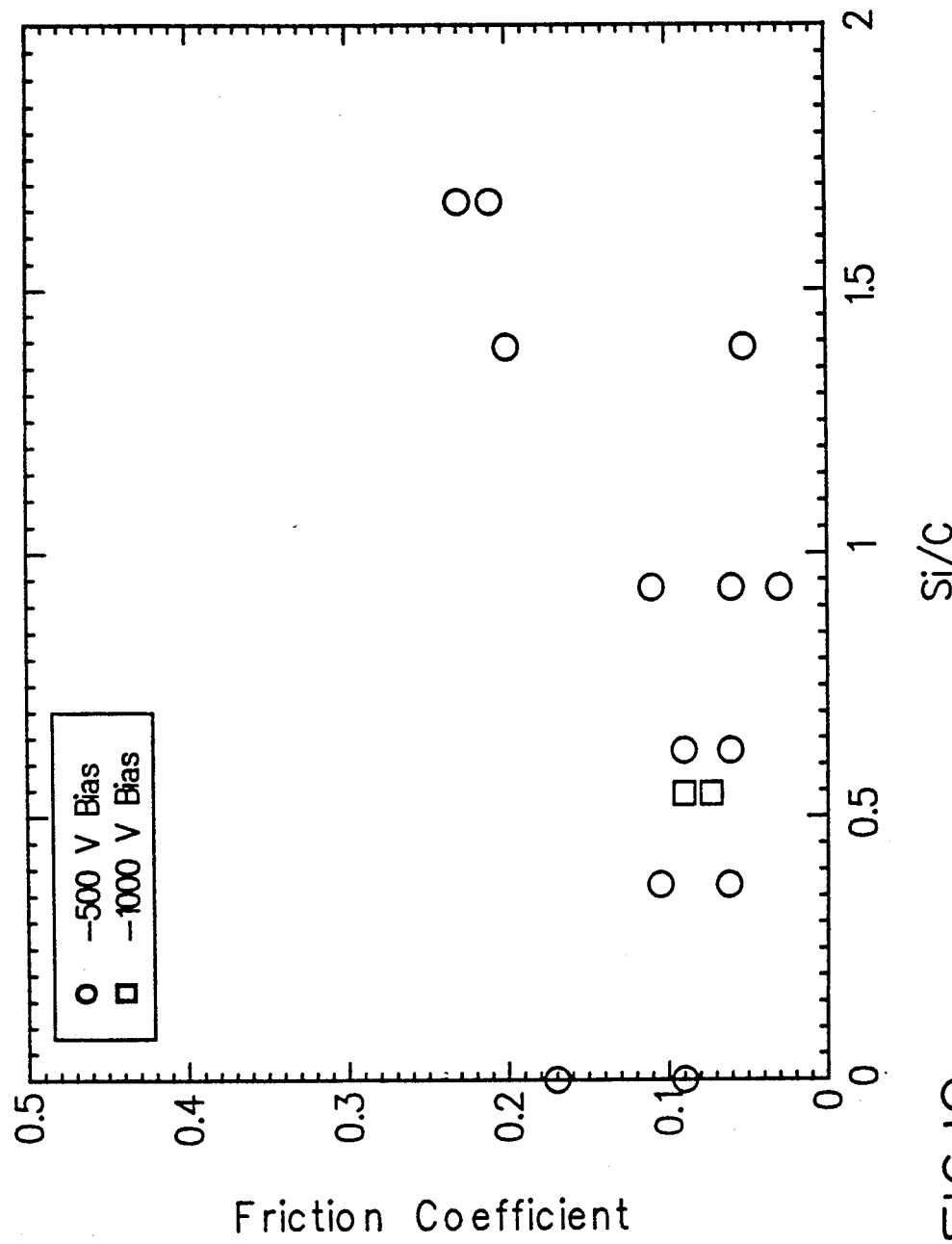
FIG. 10 is a graph illustrating the variation of friction coefficients of amorphous hydrogenated carbon films with silicon content of films deposited at different bias voltage levels.

In FIG. 10, there is a graph of friction coefficients in amorphous hydrogenated carbon films containing various amounts of silicon. Those films were deposited on silicon substrates. The data suggests that at certain film compositions, it is possible to obtain friction coefficients which are lower than silicon-free films. The film deposited at −1000V exhibited similar friction characteristics. The advantage is that films deposited at −1000V have less compressive stress. Thus, it is possible to grow thicker films (over 10 microns), while undoped amorphous hydrogenated carbon films are typically limited in thickness to about 2 microns or less.

Figure 11:
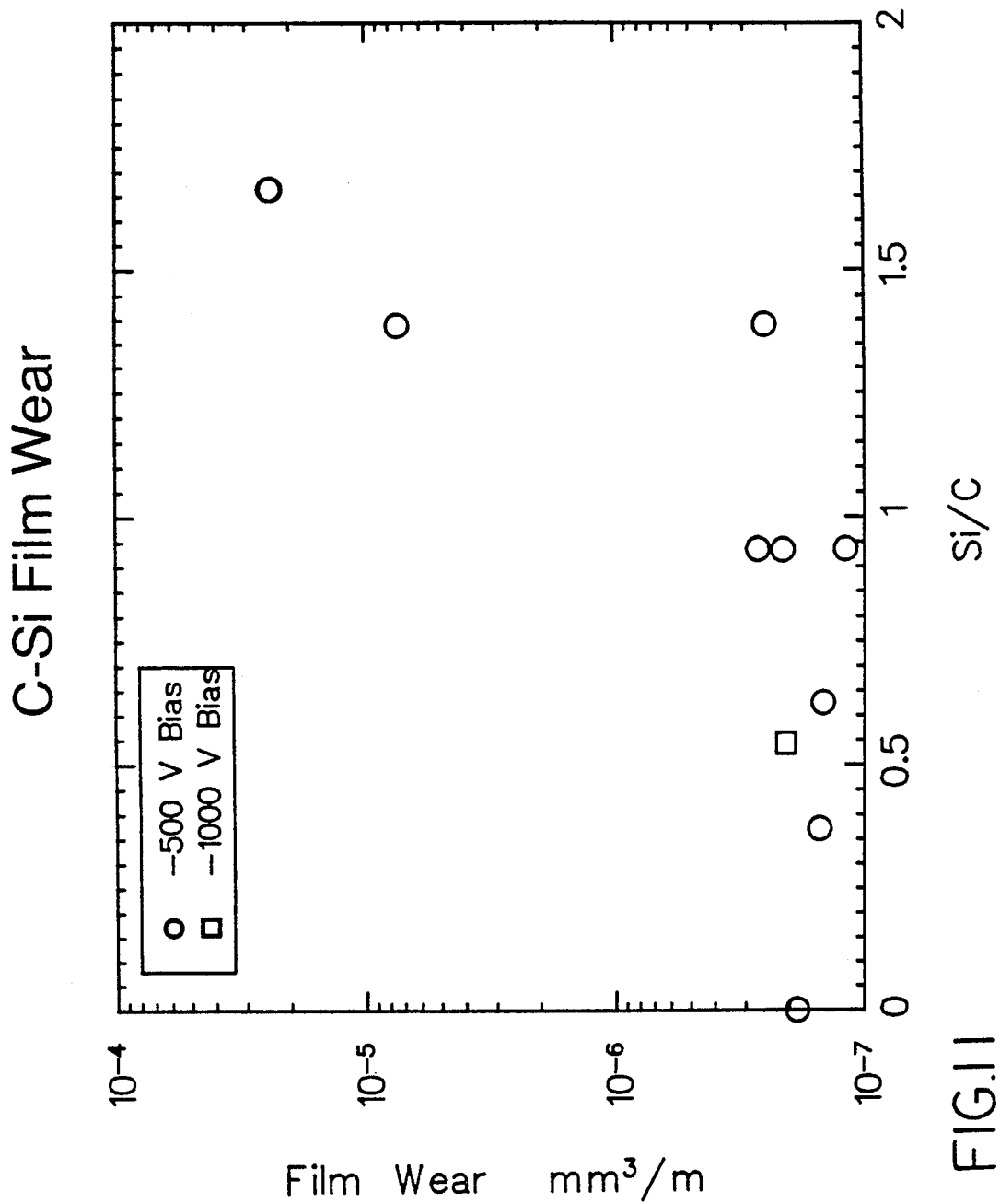
FIG. 11 is a graph illustrating the wear rate of amorphous hydrogenated carbon films with various amounts of silicon deposited at different bias voltage levels.

FIG. 11 illustrates the wear rate of amorphous hydrogenated carbon films containing various amounts of silicon. At certain film compositions, the wear rate of the film is comparable to or less than a silicon-free film.

Turning now to FIG. 12, there is a graph of friction coefficients of silicon-free and silicon-containing amorphous hydrogenated carbon films versus relative humidity. The friction coefficients of silicon-free films increase as the humidity increases. However, for silicon-containing films (Si/C=0.05-0.55), over the humidity range tested. The wear of a steel ball, for example, also increases significantly with increase in humidity for silicon-free films. But for the silicon-containing films, the wear of the steel ball did not increase with humidity. The incorporation of silicon stabilized friction coefficients and also reduced the wear of the steel balls.

Extremely hard and wear resistant coating systems include metal-doped amorphous hydrogenated carbon, where the metal is any good carbide former, as disclosed earlier, such that the non-carbon component does not exceed 40 atomic percent exclusive of hydrogen.

When boron and nitrogen are used to form boron nitride-doped amorphous hydrogenated carbon, the boron and nitrogen should be present in approximately equal amounts. Boron nitride-doped amorphous hydrogenated carbon can be deposited from a mixture of borazine and a hydrocarbon precursor such as methane. In that case, an approximately equal B-N stoichiometric mix is required. An additional source of nitrogen may usefully be deployed in the form of methyl amine or ammonia.

A preferred way of depositing the disclosed coating systems is in a capacitively-coupled parallel-plate RF-driven plasma reactor. Good results have been obtained where the electrode to which the component is attached for coating and the other electrode to which sputtering a target may be mounted (if one is used) are water-cooled. Further, the component may be heated, cooled, or electrically biased through application of DC or radio frequency potential to vary the film properties. For example, ion bombardment associated with a large negative potential tends to increase density and compressive stress. The entire assembly generally is enclosed in a vacuum chamber. Advantageously, the substrate may be cleaned and degreased by ultrasonic cleaning in a detergent (such as Alconox) and a solvent (such as acetone).

For greatest flexibility, the inventors have found that the use of a low pressure plasma enhanced chemical vapor deposition (PE-CVD) technique is suitable for film formation. The hydrocarbon source is preferably methane, but possible substituents include ethane, ethylene, acetylene, butane, propane, hexane, benzene, toluene, xylene, and mixtures thereof. Other constituents may also be included as vapor. The growth mixture is composed of the hydrocarbon and various combinations of silane, disilane, silicon chlorides and fluorides, or one of the many organosilane compounds (for Si), oxygen (for O), nitrogen, ammonia, or methyl aminel (for N), diborane (for B), borazine (for boron in combination with nitrogen), and hydrogen. Metals may be incorporated through the use of an organometallic vapor, sputtering, or evaporation. Precursor elements may also be included in other combinations such as diethylsilane ($SiH_2(C_2H_3)_2$) and organo-siloxane (which contains C, Si, and O), nitrous and nitric oxide (N and O).

The degreased component is inserted into a vacuum chamber, which is then evacuated to a system base pressure which is $10^{-6}$ torr or less in order to minimize oxygen from ambient water vapor.

The substrate may further be cleaned by a sputtering technique using an inert gas such as argon by ion bombardment. This entails admitting argon gas to a pressure in the range of 1 to 100 milli-torr and directing an RF-power to the substrate. This generates a large negative potential relative to the plasma, which draws ions from the plasma and accelerates them to the substrate. Chemically inert argon ions dislodge other atoms, thereby cleaning the substrate.

Deposition is commenced by introducing the film-depositing precursor vapors into the reaction chamber as the flow of inert gas is stopped.

As the gas mixture gradually changes from etching to deposition, an atomically mixed film-substrate transition zone assures good adhesion. Deposition is then continued until a desired film thickness is attained. In general, for optimal properties of carbon-rich film compositions, precursor ions are accelerated toward the substrate in the ion kinetic energy range of 50-200 electron volts per carbon atom.

The interlayer may be sputter-deposited before carbon film deposition by directing most of the RF-power to a sputtered target (another electrode). This shift is performed continuously without shutting off the plasma, so that all surfaces remain very clean at all times. The target then takes on a large potential relative to the plasma and it becomes sputter-etched with dislodged atoms depositing on the substrate.

The inventors have found that the compressive stress engendered during film formation tends to decrease with the absolute value of the voltage between the plasma and the substrate. Additionally, they have found that the presence of silicon in the coating system allows a higher voltage to be used. This results in a higher deposition rate, film thickness in a given interval of time, and in general, to lower compressive stresses, other things being equal.

For many applications, as illustrated in FIGS. 6–12, the interlayer may be formed from silicon. It should be realized, however, that in some environments, the deployment of an interlayer of aluminum, germanium, or elements selected from columns IVB, VB, or VIB of the periodic table, may be made with good results. In general, the selection of a suitable interlayer tends to be guided by availability of an interlayer material which tends not to be water soluble and exhibits good stability as a carbide.

Precursors for silicon and most metals are available, but almost all are toxic, corrosive, and/or explosive. The inventors have found that diethylsilane $(SiH_2)(C_2H_3)_2$ as supplied by Schumacher Chemicals, Inc., is a safe source of silicon for deposition of Si-doped amorphous hydrogenated carbon.

The disclosed films may be usefully applied to various components, such as engine and journal bearings, besides a valve stem and a valve guide. Other applications include the use of hydrogenated carbon films or doped amorphous hydrogenated carbon films at the piston-cylinder interface, and on swash plates used in compressors.

When it is desired to deposit hydrogenated carbon films on ferrous alloys, a difficulty tends to arise because carbon has a high solubility in ferrous alloys. In such cases, the interposition of the adherent interlayer may serve as an effective barrier between the substrate and the film. Suitable substrates may include aluminum, an aluminum-silicon alloy, an aluminum-copper-silicon alloy, steel and other ferrous alloys, magnesium, magnesium alloys, aluminum nitride, titanium, Ti-Al alloys, ceramics, and mixtures thereof.

Accordingly, there has been provided in accordance with the present invention an improved powertrain component and its method of preparation. The component includes one or more coating systems of films and interlayers having a composition gradient which impart the characteristics of low friction and wear resistance to the component. As a result, the average service intervals required by the component tend to be prolonged and therefore less frequent.

We claim:

1. An internal combustion engine including a powertrain component such as, but not limited to a valve lifter, the component having:
    a coating system including a film and an interlayer formed on a wear surface of the component;
    the film being selected from a first group comprising at least one of amorphous hydrogenated carbon, silicon-doped amorphous hydrogenated carbon, boron-doped amorphous hydrogenated carbon, nitrogen-doped amorphous hydrogenated carbon, boron nitride-doped amorphous hydrogenated carbon, or metal-doped amorphous hydrogenated carbon, the film imparting characteristics of low friction and wear resistance to the component;
    the interlayer being formed between the film and the component, the interlayer being selected from a second group comprising at least one of silicon, silicon carbide, silicon nitride, and boron nitride, the interlayer accommodating stresses engendered by formation of the film, and providing mechanical support to the film, and chemical compatibility between the film and the substrate, and thereby improving adherence of the film to the substrate,
    the component being selected from at least done of a ceramic and a metal including one or more of aluminum, an aluminum-silicon alloy, an aluminum-copper-silicon alloy, magnesium, a magnesium alloy, aluminum nitride, titanium, a titanium-aluminum alloy, and an aluminum alloy.

2. A powertrain component such as, but not limited to a valve lifer, in an internal combustion engine, the component comprising:
    a coating system including a film and an interlayer formed on a wear surface of the component;
    the film being selected from a first group comprising at least one of amorphous hydrogenated carbon, silicon-doped amorphous hydrogenated carbon, boron-doped amorphous hydrogenated carbon, nitrogen-doped amorphous hydrogenated carbon, boron nitride-doped amorphous hydrogenated carbon, or metal-doped amorphous hydrogenated carbon, the film imparting characteristics of low frictions and wear resistance to the component;
    the interlayer being formed between the film and the component, the interlayer being selected from a second group comprising at least one of silicon, silicon carbide, silicon nitride, and boron nitride, the interlayer accommodating stresses engendered by formation of the film, and providing mechanical support to the film and chemical compatibility between the film and the substrate, thereby improving adherence of the film to the substrate,
    the component being selected from at least one of a ceramic and a metal including one or more of aluminum, an aluminum-silicon alloy, an aluminum-copper-silicon alloy, magnesium, a magnesium alloy, aluminum nitride, titanium, a titanium-aluminum alloy, and an aluminum alloy.

3. The powertrain component of claim 2, wherein the coating system includes:
    a composition gradient such that
        an outside surface of the coating system predominantly includes a member of the first group,
        intermediate portions of the coating system predominantly including a constituent selected from the second group, the proportion of the constituent increasing with proximity to the component.

4. The powertrain component of claim 2, wherein the film includes:
    a composition gradient such that
        an outside surface of the film predominantly includes a member of the first group, intermediate portions of the film predominantly including a constituent selected from the second group, the proportion of the constituent increasing with proximity to the interlayer.

5. The powertrain component of claim 2, wherein the interlayer includes:

a composition gradient such that
an outside surface of the interlayer predominantly includes a member of the first group,
intermediate portions of the interlayer predominantly including a constituent selected from the second group, the proportion of the constituent increasing with proximity to the component.

6. The powertrain component of claim 2 wherein the interlayer has a thickness between 200 angstroms and 30 microns.

7. The powertrain component of claim 2, wherein the film selected from the first group also includes an element selected from a group comprising at least one of germanium, and carbide-forming elements selected from columns IVB, VB, or VIB of the periodic table.

8. The powertrain component of claim 2, wherein the interlayer selected from the second group also includes an element selected from the group comprising at least one of aluminum, germanium, and carbide-forming elements from columns IVB, VB, or VIB of the periodic table.

9. The powertrain component of claim 2, wherein the silicon-doped amorphous hydrogenated carbon film comprises between 1-35 atomic percent of silicon provided from a diethyl-silane precursor.

10. The powertrain component of claim 3, wherein the composition gradient continuously varies between the outside surface of the coating system and a component-facing portion thereof.

11. The powertrain component of claim 3, wherein the coating system includes a composition gradient having an abruptly varying composition.

12. The powertrain component of claim 3, wherein the composition gradient continuously varies between an outside surface of the film and an interlayer-facing portion thereof.

13. The powertrain component of claim 3, wherein the film includes a composition gradient having an abruptly varying composition.

14. The powertrain component of claim 3, wherein the composition gradient continuously varies between a film-facing portion of the interlayer and a component-facing portion thereof.

15. The powertrain component of claim 3, wherein the interlayer includes a composition gradient having an abruptly varying composition.

16. The powertrain component of claim 2, wherein the film is formed from a precursor vapor selected from the group comprising at least one of ethane, ethylene, acetylene, methane, silane, disilane, silicon chloride, silicon fluoride, an organosilane compound, dimethyl silane, trimethyl silane, tetramethyl silane, diethyl silane, butane, propane, hexane, benzene, toluene, xylene, oxygen, nitrogen, methylamine, ammonia, diborane, borazine, and hydrogen.

17. The powertrain component of claim 1, wherein the film is formed from a precursor vapor selected from the group comprising at least one of ethane, ethylene, acetylene, methane, silane, disilane, silicon chloride, silicon fluoride, an organosilane compound, dimethyl silane, trimethyl silane, tetramethyl silane, diethyl silane, butane, propane, hexane, benzene, toluene, xylene, oxygen, nitrogen, methylamine, ammonia, diborane, borazine, and hydrogen.

* * * * *